US012771084B2

(12) United States Patent
Pan

(10) Patent No.: US 12,771,084 B2
(45) Date of Patent: Oct. 20, 2026

(54) MULTIFUNCTIONAL CHARGING AND DATA ADAPTER

(71) Applicant: CHANNEL WELL TECHNOLOGY CO., LTD., Taoyuan City (TW)

(72) Inventor: Yen-Cheng Pan, Taoyuan City (TW)

(73) Assignee: CHANNEL WELL TECHNOLOGY CO., LTD., Taoyuan City (TW)

( * ) Notice: Subject to any disclaimer, the term of this patent is extended or adjusted under 35 U.S.C. 154(b) by 372 days.

(21) Appl. No.: 18/396,739

(22) Filed: Dec. 27, 2023

(65) Prior Publication Data

US 2025/0183605 A1 Jun. 5, 2025

(30) Foreign Application Priority Data

Dec. 4, 2023 (TW) ................................ 112147044

(51) Int. Cl.
*H05K 1/02* (2006.01)
*H01R 13/50* (2006.01)
(Continued)

(52) U.S. Cl.
CPC ........... *H01R 31/065* (2013.01); *H01R 13/50* (2013.01); *H01R 13/6658* (2013.01); *H02J 7/70* (2026.01);
(Continued)

(58) Field of Classification Search
CPC ...... H02J 50/80; H02J 7/42; H02J 7/70; H02J 7/731; H01R 31/065; H05K 2201/058; G06F 1/1632; G06F 1/188
(Continued)

(56) References Cited

U.S. PATENT DOCUMENTS 6,563,714 B2 * 5/2003 Chang .................... H01R 27/02
361/728
6,614,206 B1 * 9/2003 Wong ........................ H02J 7/70
320/135
(Continued)

FOREIGN PATENT DOCUMENTS

CN 101634872 A * 1/2010
CN 212849207 U * 3/2021
EP 3227975 B1 * 4/2019 ........... H05K 1/0245

OTHER PUBLICATIONS

Aufranc, "Minix Neo S1 & S2 Combine SSD and USB-C Hub into a Single Device", Jun. 19, 2019, https://www.cnx-software.com/2019/06/19/minix-neo-s1-s2-ssd-usb-c-hub/.*

*Primary Examiner* — Adrian S Wilson

(57) ABSTRACT

A multifunctional charging and data adapter includes a housing, a plurality of data transmission connection holes, a first circuit board, a second circuit board, a charging plug, a charging module and a flexible circuit board. The first circuit board is provided with at least one of the data transmission connection holes. The second circuit board is adjacent to the first circuit board and is provided with at least another of the data transmission connection holes. The charging plug and the charging module are configured to receive external electrical power via the charging plug and transmit the external power to at least one of the data transmission connection holes via the first or second circuit board. The flexible circuit board is configured to be electrically connected between the first and second circuit boards so as to provide an electrical signal transmission path between the first and second circuit boards.

13 Claims, 7 Drawing Sheets

(51) Int. Cl.

| | |
|---|---|
| ***H01R 13/66*** | (2006.01) |
| ***H01R 31/06*** | (2006.01) |
| ***H02J 7/70*** | (2026.01) |
| ***H05K 1/189*** | (2026.01) |

(52) U.S. Cl.
CPC ........... *H05K 1/0216* (2013.01); *H05K 1/189* (2013.01); *H02J 2207/30* (2020.01); *H05K 2201/04* (2013.01); *H05K 2201/057* (2013.01); *H05K 2201/058* (2013.01)

(58) Field of Classification Search
USPC ... 361/679.4, 679.41, 679.45, 752, 784, 796
See application file for complete search history.

(56) References Cited

U.S. PATENT DOCUMENTS

| | | | | | |
|---|---|---|---|---|---|
| 6,650,549 | B1 * | 11/2003 | Chiao | H04L 12/4625 | 710/63 |
| 6,663,420 | B1 * | 12/2003 | Xiao | H01R 31/065 | 439/502 |
| 7,167,372 | B2 * | 1/2007 | Mori | G06F 1/1632 | 439/284 |
| 7,556,525 | B2 * | 7/2009 | Chen | H05K 1/028 | 439/498 |
| 7,573,159 | B1 * | 8/2009 | Deluliis | H01R 31/065 | 307/150 |
| 7,899,970 | B2 * | 3/2011 | Mori | G06F 13/4022 | 710/313 |
| 8,169,187 | B2 * | 5/2012 | Fischer | H01R 13/6675 | 320/111 |
| 9,414,493 | B2 * | 8/2016 | Doering | H01R 12/73 | |
| 9,529,768 | B2 * | 12/2016 | Chu | G06F 13/4068 | |
| 10,148,124 | B1 * | 12/2018 | Chang | H02M 3/285 | |
| 10,361,498 | B2 * | 7/2019 | Chuang | H05K 1/117 | |
| 11,032,450 | B2 * | 6/2021 | Lim | H04N 23/50 | |
| 11,509,160 | B2 * | 11/2022 | Pan | H02J 7/02 | |
| 2006/0256538 | A1 * | 11/2006 | Mori | G06F 3/0227 | 361/752 |
| 2006/0273817 | A1 * | 12/2006 | Hsieh | H04W 88/02 | 343/702 |
| 2007/0217127 | A1 * | 9/2007 | Pan | H05K 7/20136 | 361/601 |
| 2009/0115395 | A1 * | 5/2009 | Pan | H02J 1/08 | 323/371 |
| 2010/0067197 | A1 * | 3/2010 | Guccione | G06F 1/1632 | 361/728 |
| 2011/0286173 | A1 * | 11/2011 | Moore | G11B 33/08 | 29/458 |
| 2013/0073776 | A1 * | 3/2013 | Johnson | G06F 13/4022 | 710/316 |
| 2014/0307376 | A1 * | 10/2014 | Lee | G06F 1/1632 | 361/679.4 |
| 2014/0312691 | A1 * | 10/2014 | Doljack | H02J 7/685 | 307/29 |
| 2017/0271791 | A1 * | 9/2017 | Whatcott | H05K 1/147 | |
| 2020/0341511 | A1 * | 10/2020 | Li | G06F 1/1616 | |
| 2021/0240225 | A1 * | 8/2021 | Kort | H01R 13/516 | |
| 2021/0397235 | A1 * | 12/2021 | Schneider | G06F 1/266 | |
| 2022/0060044 | A1 * | 2/2022 | Pan | H02J 7/04 | |
| 2022/0255372 | A1 * | 8/2022 | Nord | H02J 50/10 | |
| 2023/0125019 | A1 * | 4/2023 | Chin | G06F 1/1632 | 361/679.41 |
| 2023/0188633 | A1 * | 6/2023 | Yoon | G06F 1/1626 | 455/575.1 |
| 2023/0253806 | A1 * | 8/2023 | Frydendal | H02J 7/70 | 320/107 |

* cited by examiner

MULTIFUNCTIONAL CHARGING AND DATA ADAPTER

CROSS-REFERENCE TO RELATED APPLICATION

This non-provisional application claims priority under 35 U.S.C. § 119(a) on patent application No. 112147044 filed in Taiwan, R.O.C. on Dec. 4, 2023, the entire contents of which are hereby incorporated by reference.

BACKGROUND OF THE INVENTION

1. Field of the Invention

The present disclosure provides a charging and data adapter, and in particular to a multifunctional charging and data adapter providing both a charging function and all-in-one data adaptation integration.

2. Description of the Related Art

When a user wishes to connect an electronic device such as a cellphone, a tablet computer or a laptop computer to a television, a projector or another electronic device, an adapter (or generally referred to as a hub) is frequently needed in order to bridge signals of the electronic device to another electronic device.

A common adapter is usually monofunctional, and handles only one or two conversion functions, for example, converting USB to HDMI, USB to a memory card or USB to an Ethernet interface, and may not be able to support high-speed data transmission. If multiple functions are integrated into one adapter, the volume of the adapter would be made too large and bulky.

Moreover, a common adapter does not provide a charging function, and a user often needs to prepare or carry one charger plug and more than one data adapter connector in order to meet requirements of charging a mobile electronic device while being able to transmit file data or multimedia data to another electronic device.

BRIEF SUMMARY OF THE INVENTION

However, for a user to carry both one charger plug and more than one data adapter connector, in addition to resulting difficulties and complications in use due to the charger and the adapter carried, the charger plug and the adapter connector need to occupy two spaces for storage. Thus, a quite large amount of volume is occupied to store the charger plug and the adapter connector in order to meet both storage and portability requirements.

In addition, each of the charger plug and the data adapter is rather monofunctional, in a way that an electronic device cannot be readily used to its full capability if a user only remembers to carry one of them. When a user carries only the charger plug, data cannot be converted or transmitted; when a user carries only the data adapter, an electronic device cannot be quickly or efficiently charged.

Moreover, if the charger plug and the data adapter are simply integrated and incorporated into one apparatus, an overly large volume of an adapter with a charging function would then account for one of the main reasons why such apparatus cannot be readily used with ease.

On the other hand, to meet the demand of high-speed data transmission among different ports, a conventional all-in-one data adapter employs one single circuit board as a path of data transmission among different ports. However, while the one single circuit board has different data ports, this one single circuit board capable of accommodating these different data ports inevitably occupies an extremely large space, such that the volume of a corresponding adapter cannot be further reduced.

Therefore, it is imperative to provide a multifunctional charging and data adapter, which attempts to include both functions of charging and high-speed data transmission among different types of data ports, and at the same time has a minimized volume so as to be readily portable and be easily stored for a user.

In view of the above, the present disclosure provides a multifunctional charging and data adapter suitable for an electronic device. The multifunctional charging and data adapter includes: a housing; a plurality of data transmission connection holes, disposed at the housing; a first circuit board, disposed in the housing, the first circuit board provided with at least one of the data transmission connection holes; a second circuit board, disposed in the housing and adjacent to the first circuit board, the second circuit board provided with at least another of the data transmission connection holes; a charging plug, disposed at the housing; a charging module, electrically connected to the charging plug and electrically connected to the first circuit board or the second circuit board, the charging module configured to receive external electrical power via the charging plug and transmit the external power to at least one of the data transmission connection holes via the first circuit board or the second circuit board; and a flexible circuit board, configured to be electrically connected between the first circuit board and the second circuit board so as to provide an electrical signal transmission path between the first circuit board and the second circuit board.

In the multifunctional charging and data adapter above, the first circuit board and the second circuit board are arranged perpendicular to each other.

In the multifunctional charging and data adapter above, the first circuit board and the second circuit board are arranged parallel to each other.

In the multifunctional charging and data adapter above, the first circuit board includes a first flexible circuit connection hole, the second circuit board includes a second flexible circuit connection hole, the flexible circuit board is configured to be connected between the first flexible circuit connection hole and the second flexible circuit connection hole, and the first flexible circuit connection hole and the second flexible circuit connection hole are arranged adjacent to each other.

The multifunctional charging and data adapter further includes: a third circuit board, disposed in the housing and adjacent to the first circuit board and the second circuit board, the third circuit board configured to be electrically to at least yet another of the plurality of data transmission connection holes; and another flexible circuit board, configured to be electrically connected between the third circuit board and the first circuit board, or electrically connected between the third circuit board and the second circuit board, so as to provide an electrical signal transmission path to the first circuit board or the second circuit board; wherein the second circuit board is arranged parallel to the third circuit board, and the second circuit board and the third circuit board are arranged perpendicular to the first circuit board.

In the multifunctional charging and data adapter above, the third circuit board includes a third flexible circuit connection hole, the first flexible circuit connection hole, the second flexible circuit connection hole and the third flexible circuit connection hole are arranged adjacent to one another, the flexible circuit board is configured to be connected between the third flexible circuit connection hole and the second flexible circuit connection hole, and a portion of the flexible circuit board has a bending extension portion which extends to and is connected to the first circuit board.

In the multifunctional charging and data adapter above, the first circuit board further includes at least one memory card slot, the second circuit board and the charging module are disposed on a first surface of the first circuit board, and the at least one memory card slot is disposed on a second surface opposite to the first surface of the first circuit board.

The multifunctional charging and data adapter above further includes a solid state drive (SSD) module disposed at the first circuit board, wherein the SSD module is configured to be suitably electrically connected to at least one of the plurality of data transmission connection holes.

In the multifunctional charging and data adapter above, the second circuit board and the charging module are disposed on a first surface of the first circuit board, and the SSD module is disposed on a second surface opposite to the first surface of the first circuit board.

In the multifunctional charging and data adapter above, the flexible circuit board is a double-layer board structure.

In the multifunctional charging and data adapter above, the flexible circuit board includes a shielding structure.

In the multifunctional charging and data adapter above, the plurality of data transmission connection holes are compliant with a specification selected from a group consisting of USB type-C, USB type-A, HDMI, RJ45, SD card and micro SD card.

In the multifunctional charging and data adapter above, the charging module is configured to be suitable for quick charging (for example, Power Delivery (PD)).

In the multifunctional charging and data adapter above, the first circuit board includes a memory card data transmission module electrically connected to a memory card data transmission connection hole; the second circuit board includes a USB data transmission module electrically connected to a USB type-C data transmission connection hole, a USB type-A data transmission connection hole and an HDMI data transmission connection hole, wherein connection hole directions of the USB type-C data transmission connection hole, the USB type-A data transmission connection hole and the HDMI data transmission connection hole are arranged parallel to a normal vector of the second circuit board; the third circuit board includes an Ethernet data transmission module electrically connected to an Ethernet data transmission connection hole; the second circuit board is arranged parallel to the third circuit board, and the second circuit board and the third circuit board are arranged perpendicular to the first circuit board; the charging module, the second circuit board and the third circuit board are disposed on a first surface of the first circuit board, and the memory card data transmission connection hole is disposed on a second surface opposite to the first surface of the first circuit board; and the first circuit board, the second circuit board and/or the third circuit board are/is electrically connected by the flexible circuit board.

With the multifunctional charging and data adapter of the present disclosure, only one charging adapter is needed to achieve both charging and data transmission and conversion among different interface connection holes. In addition to solving the issue of needing two apparatuses including a charger and a data adapter for functions of charging and data adaptation and transmission for an electronic device, with the circuit boards arranged parallel to or perpendicular to each other in space disclosed by the present disclosure, as well as the flexible circuit board serving for high-speed data transmission between a circuit board and another circuit board and its corresponding space arrangement, unnecessary space waste can be fully reduced, and the overall volume of the multifunctional charging and data adapter can be minimized to be close to the volume of necessary electronic components included therein, thereby achieving efficient use and ease of use by one single adapter with charging and all-in-one data adaptation functions.

DETAILED DESCRIPTION OF THE INVENTION

The technical contents of the present disclosure are further described in detail by way of embodiments with the accompanying drawings below. It should be noted that, in the content of the present disclosure, terms herein such as "first", "second" and "third" are used to distinguish differences among elements, and are not to be construed as limitations to the elements themselves or specific order of the elements. Moreover, in the content of the present disclosure, when a specific number is not specified, the article "a/an/one" refers to one element or more than one element.

To facilitate understanding of the object, characteristics and effects of the present disclosure, embodiments together with the attached drawings for the detailed description of the present disclosure are provided below.

Figure 1A:
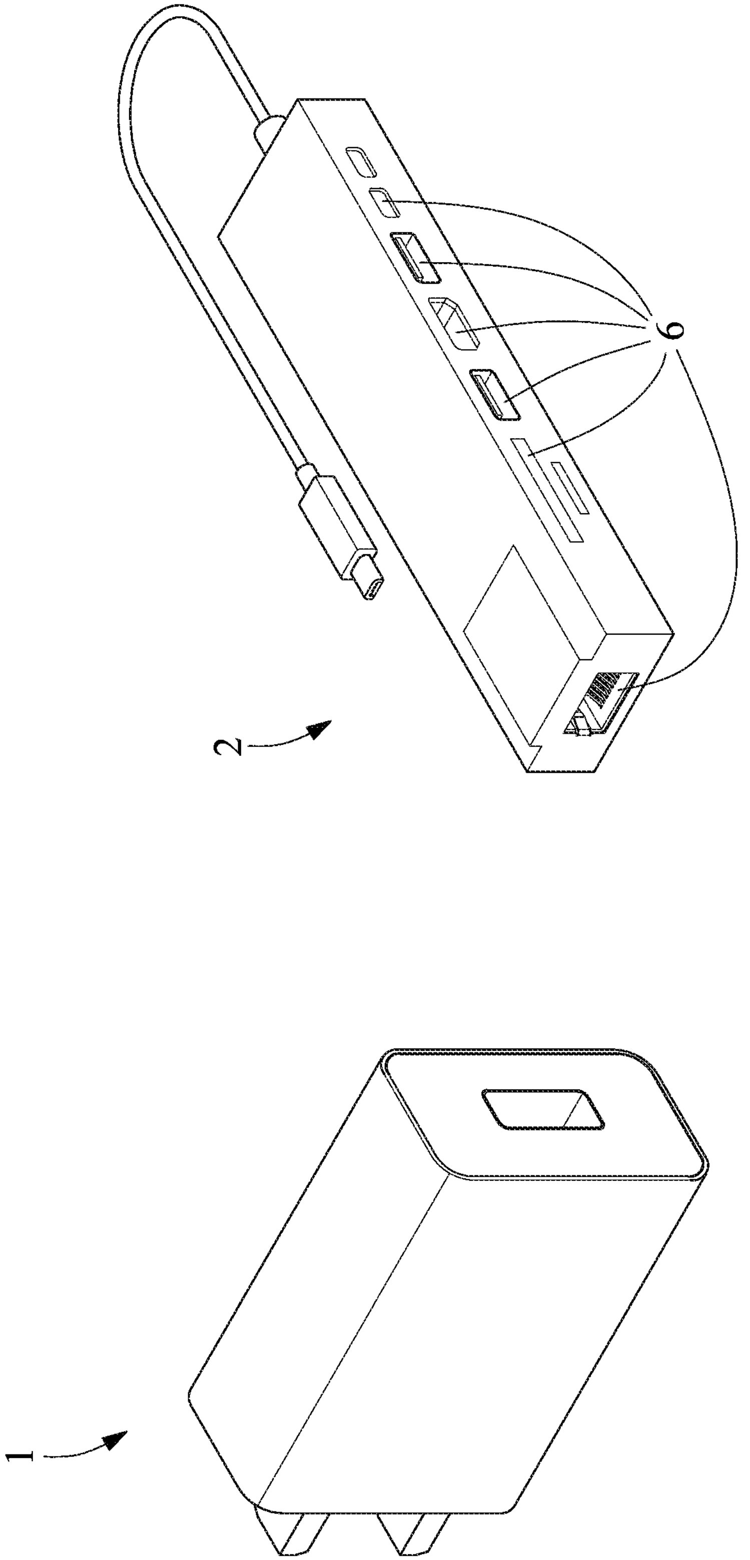
FIG. 1A ( prior art )
FIG. 1A is a schematic diagram of a charger and a data adapter of the prior art.
Figure 1B:
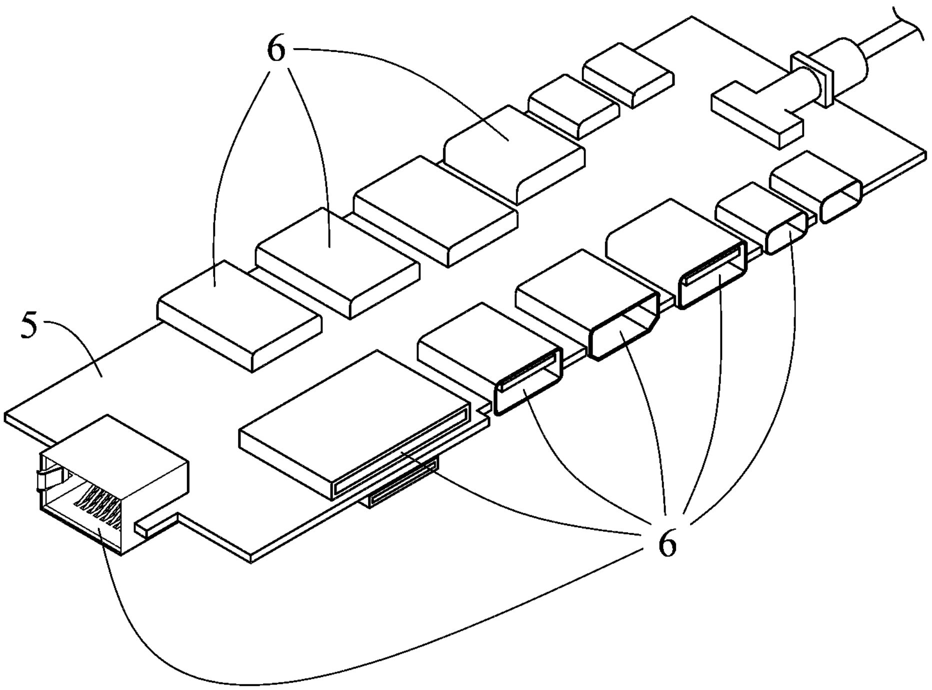
FIG. 1B ( prior art )
FIG. 1B is a schematic diagram of a circuit board and connection ports in a data adapter of the prior art.

FIG. 1A shows a schematic diagram of a charger and a data adapter of the prior art. FIG. 1B shows a schematic diagram of a circuit board and connection ports in a data adapter of the prior art.

As shown in FIG. 1A, a charger 1 of a conventional electronic device such as a cellphone, a tablet computer, a laptop computer, a wearable device, a multimedia device or a smart home appliance does not include a data adapter 2 for a transmission function of exchanging data with various data connection holes 6 such as USB, HDMI, SD card or Ethernet. Similarly, the conventional data adapter 2 does not include a plug which can be directly plugged to a socket or the charger 1 of a transformer set, and thus does not offer an electronic device with a charging function. Even if the data adapter 2 has a connector for inserting by a power supply line to power an electronic device, additional charger plug and transformer are still needed in order to acquire such power supply.

FIG. 1B shows a schematic diagram of an internal circuit board 5 and data connection holes 6 of the data adapter 2 shown in FIG. 1A. The conventional all-in-one data adapter 2 is, for example, an adapter having a USB, HDMI, SD card and Ethernet data adaptation and transmission function, employs one single circuit board 5 in order to meet requirements of high-speed data transmission among different types of ports. For example, a printed circuit board (PCB) is used to serve as a path for data transmission among different types of ports. Moreover, a processing module and an integrated circuit (IC) corresponding to different types of data connection holes are provided on this one single circuit board 5. However, while including different types of data connection holes 6, this one single circuit board 5 inevitably occupies an extremely large planar space in order to accommodate these different types of data connection holes 6. As shown in in FIG. 1B, the form of the one single circuit board 5 needs to be provided with the connections holes sequentially disposed on edges thereof, such that the volume of the conventional all-in-one data adapter 2 cannot be further reduced.

The present disclosure provides a multifunctional charging and data adapter, which is capable of providing both a charging function and a data adaptation function and has a better internal space configuration so as to reduce the overall volume of the multifunctional charging and data adapter.

Figure 2:
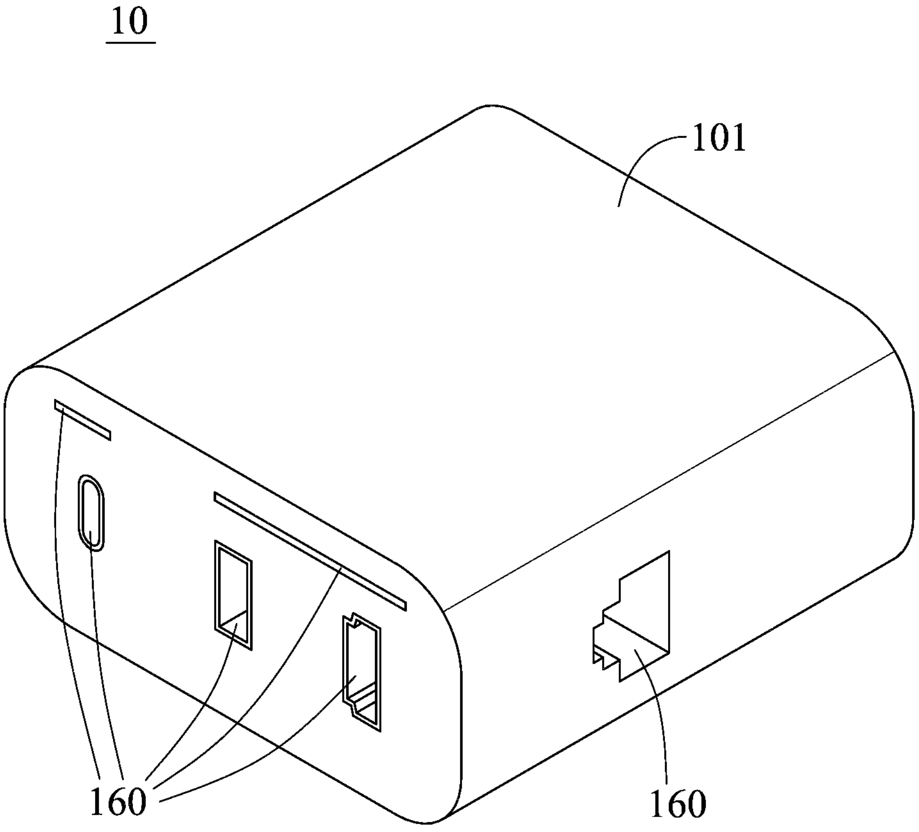
FIG. 2 is a perspective schematic diagram of a multifunctional charging and data adapter according to an embodiment of the present disclosure.

FIG. 2 shows a perspective schematic diagram of a multifunctional charging and data adapter according to an embodiment of the present disclosure. The present disclosure provides a multifunctional charging and data adapter 10 suitable for charging and data adaptation of an electronic device. The electronic device is, for example but not limited to, an electronic device such a cellphone, a tablet computer, a laptop computer, a gaming machine, a handheld game console, a wearable device, a multimedia device, a smart home appliance, a workstation, a server or an Internet device suitable for charging and data transmission. The data adaptation is in a form of a data transmission and interface or a physical connection hole, for example but not limited to, USB type-C, USB type-A, HDMI, Ethernet, SD card, micro SD card. As shown in FIG. 2, the multifunctional charging and data adapter 10 includes a housing 101 and a plurality of data transmission connection holes 160, so as to provide data transmission among interfaces of different connection holes, for example, transmitting multimedia data in a cellphone via the data transmission connection holes 160 of the multifunctional charging and data adapter 10 to a television for playback. In one embodiment, the plurality of data transmission connection holes 160 are compliant with a specification selected from a group consisting of USB type-C, USB type-A, HDMI, Ethernet (for example, RJ45 connector), SD card and micro SD card.

Figure 3:
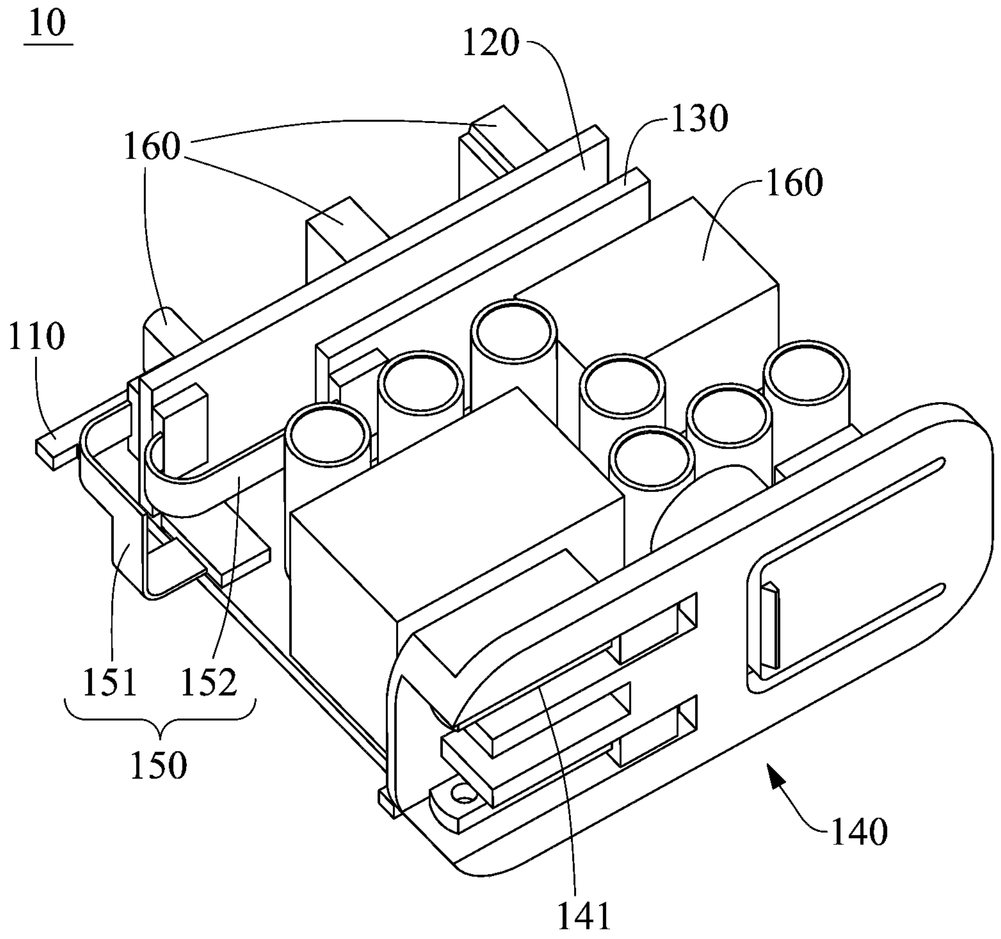
FIG. 3 is a schematic diagram of an internal configuration of a multifunctional charging and data adapter according to an embodiment of the present disclosure.

FIG. 3 shows a schematic diagram of an internal configuration of a multifunctional charging and data adapter according to an embodiment of the present disclosure. The multifunctional charging and data adapter 10 further includes a first circuit board 110, a second circuit board 120, a charging module 140, a charging plug 141, a flexible circuit board 150 and the plurality of data transmission connection holes 160.

The first circuit board 110 is disposed in the housing 101, and is provided with at least one of the plurality of data transmission connection holes 160.

The second circuit board 120 is disposed in the housing 101 and adjacent to the first circuit board 110, and is provided with at least another of the plurality of data transmission connection holes 160. The charging plug 141 is disposed at the housing 101. In one embodiment, the charging plug 141 can be rotatably accommodated or extended.

The charging module 140 is electrically connected to the charging plug 141, and electrically connected to the first circuit board 110 or the second circuit board 120. The charging module 140 is configured to receive external electrical power, for example, utility power from a power socket, via the charging plug 141, and transmit the electrical power to one or more of the plurality of data transmission connection holes 160 via the first circuit board 110 or the second circuit board 120, for example, supplying the power to connection holes with USB type-C, USB type-A and/or HDMI interfaces. In one embodiment of the present disclosure, the charging module 140 includes a transformer, an electromagnetic interference (EMI) filter unit, a capacitor, and a charging control IC. In one embodiment of the present disclosure, the charging module 140 supports high-power quick charge such as Power Delivery (PD), for example, supporting charging of PD 65 W, and provides data transmission while charging.

The flexible circuit board 150 is configured to be electrically connected between a circuit board and another circuit board. The flexible circuit board 150 can be one or plural in quantity. In one embodiment, the flexible circuit board 150 includes a first flexible circuit board 151 and a second flexible circuit board 152, which are electrically connected between different circuit boards and electronic elements. In one embodiment, as shown in FIG. 3, the first flexible circuit board 151 is configured to be electrically connected between the first circuit board 110 and the second circuit board 120, so as to provide an electrical signal transmission path between the first circuit board 110 and the second circuit board 120. The second flexible circuit board 152 is configured to be electrically connected between the second circuit board 120 and a third circuit board 130, so as to provide an electrical signal transmission path between the second circuit board 120 and the third circuit board 130. It should be noted that high-speed signals cannot be transmitted directly in a board-to-board manner using a gold-plated connection component (also referred to as a golden finger) between the first circuit board 110 and the second circuit board 120, and board-to-board signal transmission cannot be performed directly by means of welding. Therefore, in order to provide high-speed signal transmission between the first circuit board 110 and the second circuit board 120, the flexible circuit board (FPC) 150 is used in the present disclosure for high-speed signal transmission, for example, USB 3.0 high-speed signal transmission. By using the flexible circuit board 150 with features of being flexible, thin, bendable and foldable as desired, high-speed signal transmission between circuit boards can be achieved within a small space; for example, high-speed signal transmission between the first circuit board 110 and the second circuit board 120 is achieved by using the first flexible circuit board 151. In one embodiment of the present disclosure, the flexible circuit board 150 is implemented by a double-layer board structure, so as to better control impedance and reduce impedance between contacts and signal reflection. In one embodiment of the present disclosure, the flexible circuit board 150 is made of polyimide (PI) as a base material, and is structurally adapted to adjust and reduce impedance between contacts thereof. In one embodiment of the present disclosure, the flexible circuit board 150 includes a shielding structure. By adding a shield to upper and lower surfaces of the flexible circuit board 150, sources of interference in an external ambient environment are isolated to enhance stability of signals. For example, the shield is a metal copper foil layer disposed on upper and lower surfaces of the flexible circuit board 150. Thus, with the flexible circuit board 150 (for example, the first flexible circuit board 151), in addition to providing high-speed signal transmission between the first circuit board 110 and the second circuit board 120, signal transmission and configuration flexibilities within a crowded and narrow space are achieved, and the issues of EMI and impedance are also directly solved for direct board-to-board connections. It should be noted that, the configuration details of the flexible circuit board 150 and the first flexible circuit board 151 shown in the drawings are illustrative and are not restrictive.

Figure 4:
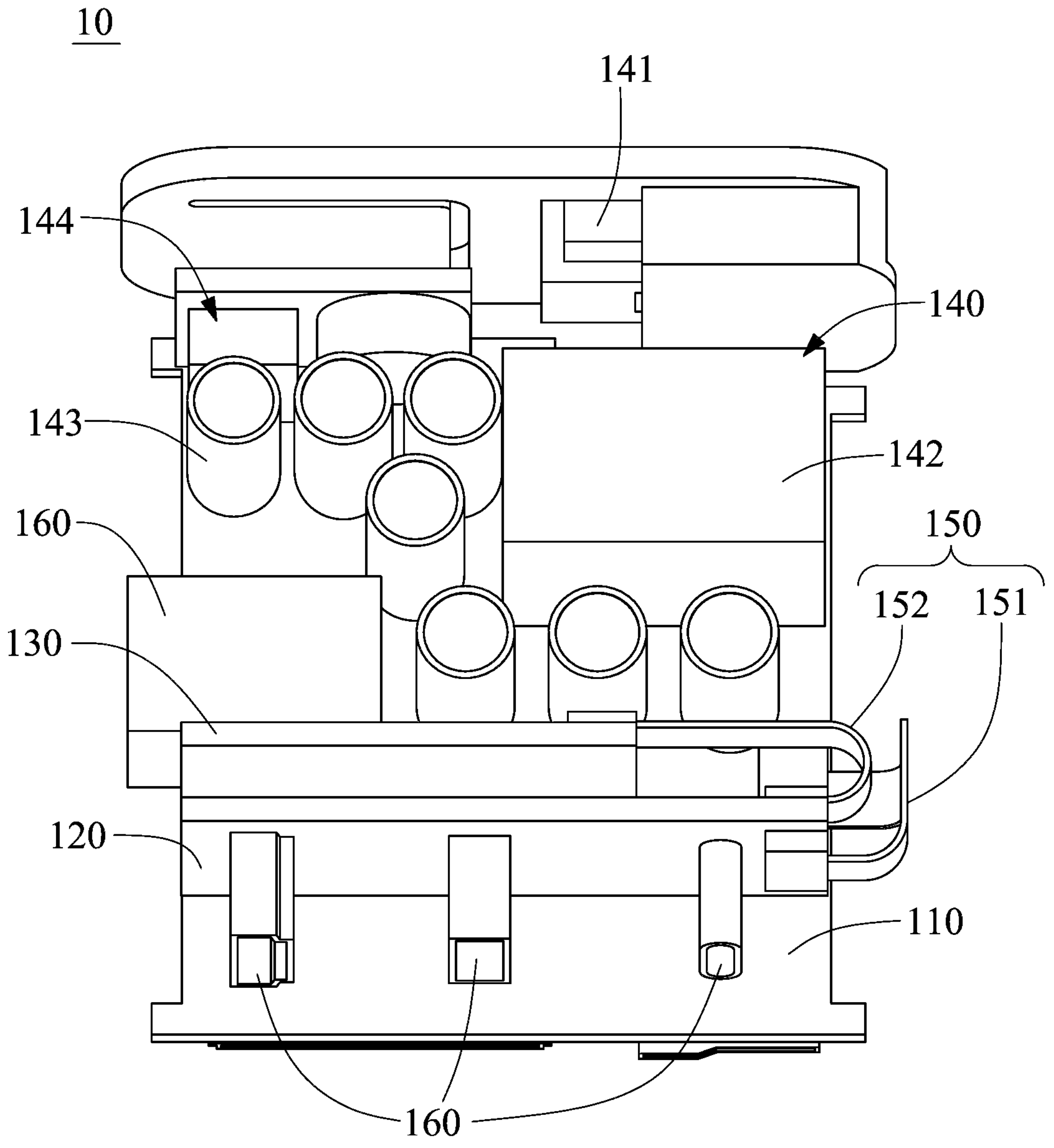
FIG. 4 is a schematic diagram of an internal configuration of a multifunctional charging and data adapter from another angle of view according to an embodiment of the present disclosure.

FIG. 4 shows a schematic diagram of an internal configuration of a multifunctional charging and data adapter from another angle of view according to an embodiment of the present disclosure. In one embodiment of the present disclosure, the multifunctional charging and data adapter 10 includes a first circuit board 110, a second circuit board 120, a third circuit board 130, a charging module 140, a charging plug 141, a flexible circuit board 150, and a plurality of data transmission connection holes 160 which are such as connection holes for USB type-C, USB type-A, HDMI, RJ45, SD card and micro SD card interfaces. In one embodiment of the present disclosure, as shown in FIG. 4, the third circuit board 130 is disposed in a housing (not shown) and adjacent to the first circuit board 110 and the second circuit board 120. The third circuit board 130 is configured to be electrically connected to at least yet another of the plurality of data transmission connection holes 160; that is, the first circuit board 110, the second circuit board 120 and the third circuit board 130 have different respective data transmission connection holes 160. As shown in FIG. 4, the second circuit board 120 is arranged parallel to the third circuit board 130, and the second circuit board 120 and the third circuit board 130 are arranged perpendicular to the first circuit board 110; that is, each of the second circuit board 120 and the third circuit board 130 is arranged perpendicular to the first circuit board 110. In one embodiment, the first circuit board 110 can also be arranged parallel to the second circuit board 120. Thus, a plurality of circuit boards can be stacked or combined in an appropriate form of being perpendicular to or parallel to each other, so that a spatial layout and arrangement between the circuit boards (for example, circuit boards 110 to 130) and the plurality of data transmission connection holes 160 render a most compact minimal volume. In one embodiment of the present disclosure, as shown in FIG. 4, the first circuit board 110 is a motherboard having a similar size as a surface of the housing (not shown). The first circuit board 110 is provided with the charging module 140 and the charging plug 141 which is rotatably collapsible and exposed from the housing. In one embodiment of the present disclosure, the charging module 140 can include, for example, a transformer 142, a capacitor 143, an EMI filter unit 144, a charging control IC and other related electronic elements, and can have a space configuration as the exemplary form shown in FIG. 4. In one embodiment of the present disclosure, the charging module 140 is disposed on a first surface of the first circuit board 110, and the first surface of the first circuit board 110 is further provided with the second circuit board 120 and the third circuit board 130. In this embodiment, the second circuit board 120 is provided with the data transmission connection holes 160, for example, USB type-C, USB type-A and HDMI connector interfaces. In order to keep the overall volume minimal, the USB type-C, USB type-A and HDMI connector interfaces are arranged perpendicular to the second circuit board 120, and the second circuit board 120 is arranged perpendicular to the first circuit board 110, so that the overall height of the multifunctional charging and data adapter 10 can be minimized to be close to a width of the USB type-C, USB type-A and HDMI connection holes above. Moreover, the first circuit board 110 can still be able to appropriately utilize the space among these connection holes so as to maximize space utilization efficiency. In this embodiment, the third circuit board 130 is provided with the data transmission connection hole 160, for example, an RJ45 connector interface for Ethernet communications. Since the RJ45 connection hole needs to have a physical space for accommodating an RJ45 connector, the RJ45 connection hole is disposed on one side near the charging module 140, so as to provide yielding for the RJ45 connection hole by components of the charging module 140 with flexibly adjustable positions instead of having the RJ45 connection hole occupy utilization spaces of other data transmission connection holes 160. Moreover, the second circuit board 120 and the third circuit board 130 can be located as close as possible, so as to further reduce the overall volume of the multifunctional charging and data adapter 10. The second circuit board 120 and the third circuit board 130 are arranged parallel to each other and are disposed in another region of the first circuit board 110 with respect to the charging module 140, and the second circuit board 120 and the third circuit board 130 are arranged perpendicular to the first circuit board 110. Thus, the second circuit board 120 having the data transmission connection holes 160, such as the USB type-C, USB type-A and HDMI connection holes having a space configuration toward an exterior, and the third circuit board 130 having the data transmission connection hole 160 such as the RJ45 connection hole for Ethernet communications arranged toward the charging module 140, are arranged to be close as possible to each other, so as to minimize the volume occupied by all the connection holes and necessary circuits, thereby maximizing space utilization efficiency, fully reducing unused space, and minimizing the overall volume of the multifunctional charging and data adapter 10 to the volume defined by the interface connection holes and necessary elements (for example, the transformer 142). It should be noted that, the positions of the circuit boards in space are not limited to the examples above. All modifications of configurations and arrangements in which circuit boards are perpendicular to or parallel to each other in the aim of reducing areas of the circuit boards, reducing the volume of protruding components and adapting to actual interface connection holes are encompassed within the scope of concept of the present disclosure.

Figure 5:
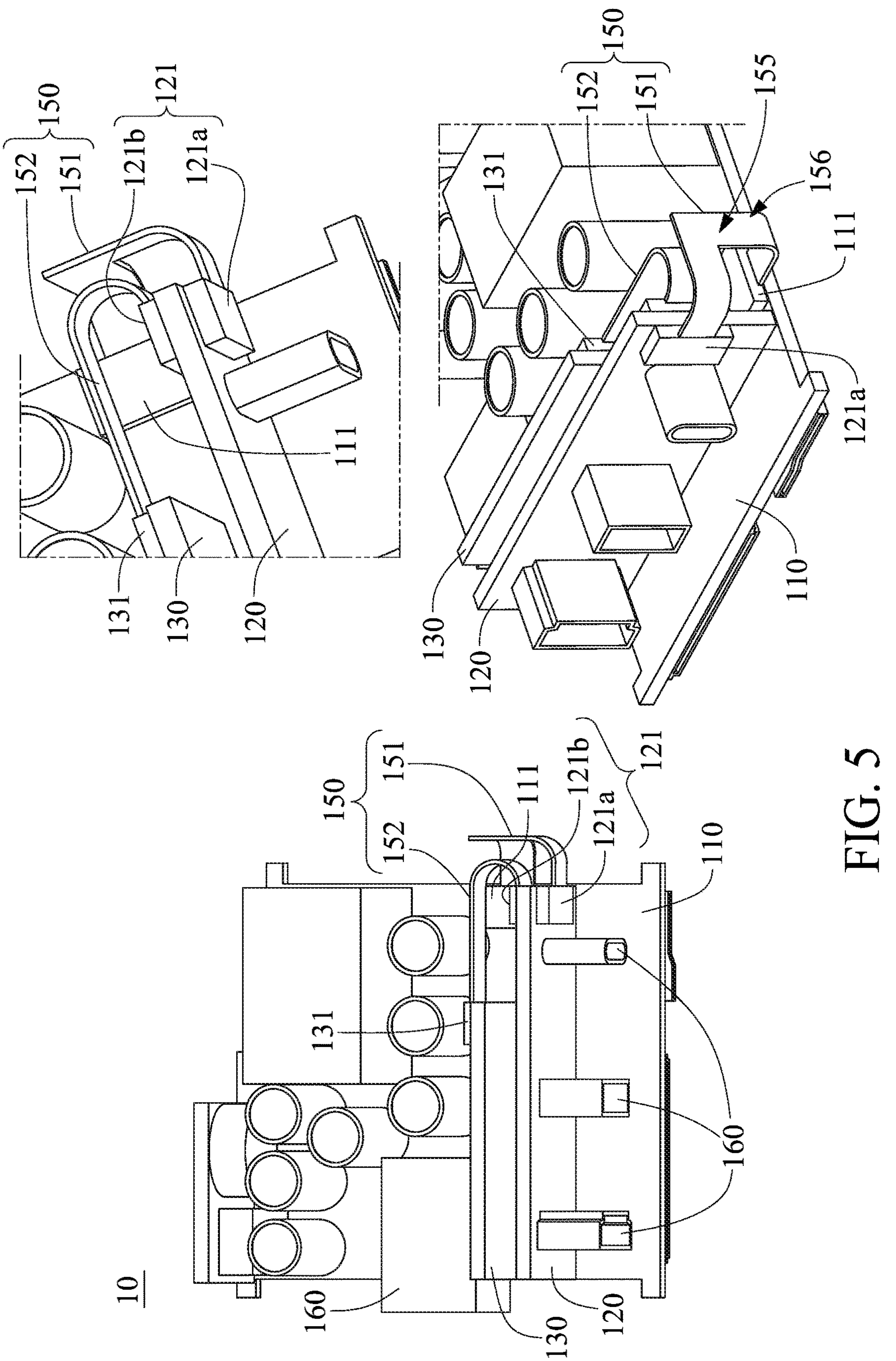
FIG. 5 is a schematic diagram of a configuration of a multifunctional charging and data adapter and a flexible circuit board thereof according to an embodiment of the present disclosure.

Next, connection and space configuration details of the first flexible circuit board 151 and the second flexible circuit board 152 included in the flexible circuit board 150 are described below. FIG. 5 shows a schematic diagram of a configuration of a multifunctional charging and data adapter and the flexible circuit board 150 thereof according to an embodiment of the present disclosure, and a partial enlarged schematic diagram from a different angle of view. In one embodiment of the present disclosure, as shown in FIG. 5, the first circuit board 110 includes a first flexible circuit connection hole 111, and the second circuit board 120 includes a second flexible circuit connection hole 121. It should be noted that, the number of the flexible circuit connection hole, for example, the first flexible circuit connection hole 111 and the second flexible circuit connection hole 121, is not limited to one. The same circuit board may include one or more flexible circuit connection holes so as to connect to a plurality of circuit boards by the flexible circuit board 150. In one embodiment, the second flexible circuit connection hole 121 includes second flexible circuit connection holes 121*a* and 121*b* respectively disposed on both sides of the second circuit board 120. The first flexible circuit board 151 is configured to be connected between the first flexible circuit connection hole 111 and the second flexible circuit connection hole 121*a*, and the first flexible circuit connection hole 111 and the second flexible circuit connection hole 121*a* are arranged adjacent to each other. Thus, a signal transmission distance of the first flexible circuit board 151 can be shortened to reduce impedance control difficulties as well as signal interference or influences in the environment, and to decrease signal transmission loss. Moreover, assembly complications of the flexible circuit board can also be reduced to promote the readiness of mass production. In one embodiment of the present disclosure, the third circuit board 130 includes a third flexible circuit connection hole 131. For example, as shown in FIG. 5, the third flexible circuit connection hole 131 and the second flexible circuit connection hole 121*b* are arranged parallel to each other and are aligned with each other in the same direction, so as to reduce forced bending and twisting of the second flexible circuit board 152 electrically connecting the two, further reducing the required space as well as further decreasing signal loss and interference. In one embodiment of the present disclosure, the first flexible circuit connection hole 111 and the second flexible circuit connection hole 121 (including connection holes 121*a* and 121*b*) are disposed adjacent to the third flexible circuit connection hole 131, so that at least one flexible circuit board 150 is configured to be connected among the first flexible circuit connection hole 111, the second flexible circuit connection hole 121 and the third flexible circuit connection hole 131, hence improving application flexibility and feasibility for connections among different circuit boards. Moreover, in this embodiment, by respectively disposing the second flexible circuit connection holes 121 of the second circuit board 120 on both sides at same positions on edges of the second circuit board, that is, as positions shown by 121*a* and 121*b*, distances among the first flexible circuit connection hole 111, the second flexible circuit connection hole 121 (including connection holes 121*a* and 121*b*) and the third flexible circuit connection hole 131 can be minimized, and at the same time the second flexible circuit connection holes 121*a* and 121*b* can be accommodated on the same side without increasing the size or width of the second circuit board 120. In addition, by connecting the second flexible circuit board 152 to the second flexible circuit connection hole 121*b* near one side of the third circuit board 130 and connecting the first flexible circuit board 151 to the second flexible circuit connection hole 121*a* on the other side away from the third circuit board 130, paths of the second flexible circuit board 152 and the first flexible circuit board 151 can be prevented from intersecting each other. A portion 155 of the first flexible circuit board 151 has a bending extension portion 156, which extends to and is connected to the first flexible circuit connection hole 111 of the first circuit board 110. In one embodiment of the present disclosure, the portion 155 including the bending extension portion 156 is located at a section perpendicular to the second circuit board 120 and the third circuit board 130. For example, the bending portion 155 at the first flexible circuit board 151 shown in FIG. 5 has the bending extension portion 156 so as to extend in a direction of the first circuit board 110, and is connected to the aligned and adapted first flexible circuit connection hole 111. Thus, the length and the number of bending for connections of the flexible circuit board 150 among a plurality of circuit boards (for example, the first circuit board 110 to the third circuit board 130) can be reduced, connections for high-speed signal transmission of a plurality of circuit boards can be achieved with the shortest path while only a minimal space is occupied, and adaptation to flexible circuit connection holes in different connection hole angles is also achieved. It should be noted that, in response to design requirements for a minimal path and flexible circuit connection hole angles for flexible circuit boards in a narrow space, the bending extension portion is not limited to being disposed at the first flexible circuit board, but other flexible circuit boards can be designed to include the bending extension portion.

Figure 6:
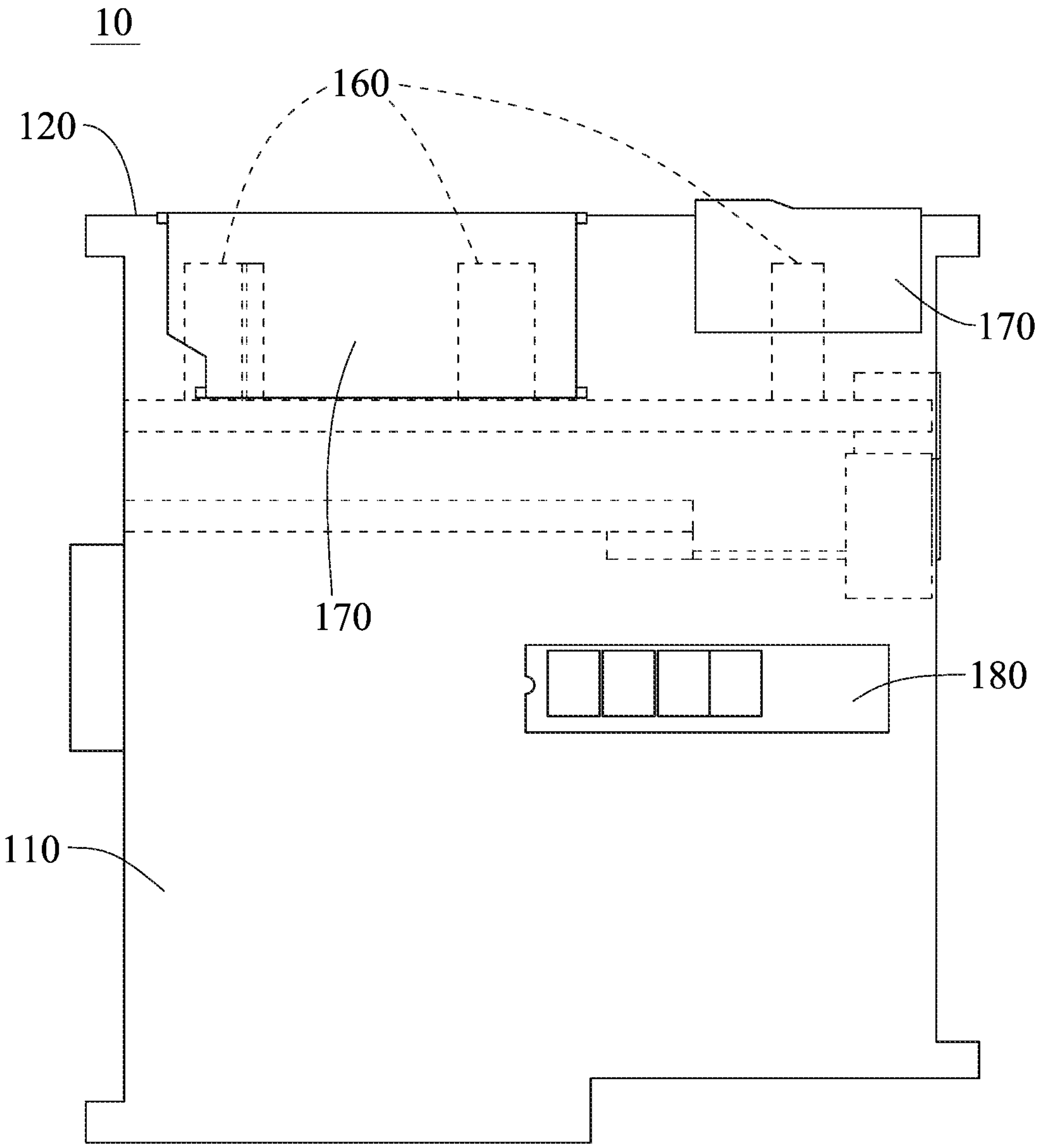
FIG. 6 is a schematic diagram of an internal configuration of a multifunctional charging and data adapter from yet another angle of view according to an embodiment of the present disclosure.

FIG. 6 shows a schematic diagram of an internal configuration of a multifunctional charging and data adapter from yet another angle of view according to an embodiment of the present disclosure, and a second surface (that is, a back surface) of the first circuit board 110 is shown as an example. In one embodiment of the present disclosure, the first circuit board 110 further includes at least one memory card slot 170, which is, for example, a slot corresponding to an SD card or a micro SD card. The memory card slot 170 can be one of the plurality of data transmission connection holes 160 described above. Herein, the memory card slot 170 is specifically used as an example because as it has a relatively flat in space, so this is used as an example in this embodiment. The second circuit board 120 and the charging module 140 are disposed on a first surface of the first circuit board 110, and the memory card slot 170 is disposed on the second surface opposite to the first surface of the first circuit board 110. For example, the second circuit board 120 and the charging module 140 are disposed on a front side of the first circuit board 110, and the memory card slot 170 is disposed on a back side of the first circuit board 110. Thus, since a three-dimensional shape of the memory card slot 170 is wide and flat, if the memory card slot 170 is disposed on the surface where numerous electronic elements such as the second circuit board 120 and the charging module 140 are disposed, the space for arranging these electronic elements would be excluded such that the required volume is increased. However, if the memory card slot 170 is disposed on the other surface opposite to these electronic elements, a space between the back surface of the first circuit board 110 and the housing can be properly utilized, hence leaving no space exclusion or waste. In one embodiment of the present disclosure, the multifunctional charging and data adapter 10 further includes a solid state drive (SSD) module 180, for example, an SSD of an M.2 SATA interface disposed at the first circuit board 110. The SSD module 180 is configured to be suitably electrically connected to at least one of the plurality of data transmission connection holes, and particularly for example, the USB type-C interface connection hole, so as to allow data access by a connected electronic device. Thus, the multifunctional charging and data adapter 10 can provide a data storage function in addition to charging and data adaptation functions, thereby enabling the multifunctional charging and data adapter 10 to also achieve a data storage function such as that of a mobile hard drive, a portable drive, a cache memory and a memory card. In one embodiment of the present disclosure, similar to the memory card slot 170, the SSD module 180 is disposed on the other surface opposite to the surface including multiple modules and circuit boards of the first circuit board 110, so that the multiple modules and circuit boards do not need to yield space for the SSD module 180 in a flat shape. Thus, the SSD module 180 can also be disposed in the space between the back surface of the first circuit board 110 and the housing without occupying an additional space, hence minimizing the overall volume of the multifunctional charging and data adapter 10.

In one embodiment of the present disclosure, the first circuit board, the second circuit board, the third circuit board and/other circuit boards can be separately or individually include a data control IC, a bus, a switch, a receiver and/or a multiplexing processor for data transmission connection holes correspondingly provided, so as to achieve signal transmission and exchange among interfaces of the plurality of data transmission connection holes. In one embodiment of the present disclosure, a transmission rate of the USB above can support 5 Gbps high-speed transmission, a resolution of the HDMI can support 4K at 60 Hz, and reading of the micro SD card can support 104 Mb/s, and the Ethernet interface can support 1 Gbps transmission.

With the electronic circuit designs and the three-dimensional space configuration among multiple circuit boards, in addition to achieving both functions of charging and data transmission and conversion among connection holes of different interfaces, the multifunctional charging and data adapter provided by the present disclosure is further able to more effectively utilize space, that is, significantly reducing the space needed for implementing the functions above.

With the multifunctional charging and data adapter of the present disclosure, only one charging adapter is needed to achieve both charging and data transmission and conversion among connection holes of different interfaces. In addition, with the circuit boards arranged parallel to or perpendicular to each other in space, as well as the flexible circuit board serving for high-speed data transmission between a circuit board and another circuit board, unnecessary space waste can be fully reduced, and the overall volume of the multifunctional charging and data adapter can be minimized to be close to the volume of necessary electronic components included therein, thereby achieving efficient use and ease of use by one single adapter with charging and all-in-one data adaptation functions. Moreover, in a preferred embodiment of the present disclosure, an 8-in-1 multifunctional charging and data adapter including quick charging (for example, PD), USB type-C, USB type-A, HDMI, Ethernet (for example, RJ45), SD card, micro SD card and data storage functions is further provided, hence significantly enhancing ease of use during use of an electronic device and eliminating inconvenience as a result of needing two or more apparatuses such as a charger plug, a data adapter and a portable drive. In comparison with a conventional combination of a charger and a data adapter, the overall volume for arrangement is also significantly reduced. In one embodiment, with the space utilization method and high-speed signal transmission method among circuit boards disclosed by the present disclosure, the 8-in-1 multifunctional charging and data adapter above can be implemented in dimensions of approximately 69 mm in length, 68 mm in width and 33 mm in height, and this is close to dimensions of a 3-in-1 data adapter currently commercially available.

The present invention is described by way of the preferred embodiments above. A person skilled in the art should understand that, these embodiments are merely for illustrating the present invention and are not to be construed as limitations to the scope of the present invention. It should be noted that all equivalent changes, replacements and substitutions made to the embodiments are encompassed within the scope of the present invention. Therefore, the scope of legal protection of the present invention should be defined by the appended claims.

What is claimed is:

1. A multifunctional charging and data adapter suitable for an electronic device, the multifunctional charging and data adapter comprising:

a housing;

a plurality of data transmission connection holes, disposed at the housing;

a first circuit board, disposed in the housing, the first circuit board provided with at least one of the plurality of data transmission connection holes;

a second circuit board, disposed in the housing and adjacent to the first circuit board, the second circuit board provided with at least another of the plurality of data transmission connection holes;

a charging plug, disposed at the housing;

a charging module, electrically connected to the charging plug and electrically connected to the first circuit board or the second circuit board, the charging module configured to receive external electrical power via the charging plug and transmitting the electrical power to at least one of the plurality of data transmission connection holes via the first circuit board or the second circuit board;

a first flexible circuit board, configured to be electrically connected between the first circuit board and the second circuit board, so as to provide an electrical signal transmission path between the first circuit board and the second circuit board;

a third circuit board, disposed in the housing and adjacent to the first circuit board and the second circuit board, the third circuit board provided with at least yet another of the plurality of data transmission connection holes; and a second flexible circuit board, configured to be electrically connected between the third circuit board and the first circuit board, or electrically connected between the third circuit board and the second circuit board, so as to provide an electrical signal transmission path to the first circuit board and or the second circuit board, wherein the second circuit board is arranged parallel to the third circuit board, and the second circuit board and the third circuit board are arranged perpendicular to the first circuit board.

2. The multifunctional charging and data adapter according to claim 1, wherein the first circuit board and the second circuit board are arranged perpendicular to each other.

3. The multifunctional charging and data adapter according to claim 1, wherein the first circuit board and the second circuit board are arranged parallel to each other.

4. The multifunctional charging and data adapter according to claim 1, wherein the first circuit board comprises a first flexible circuit connection hole, the second circuit board comprises a second flexible circuit connection hole, the first flexible circuit board is configured to be connected between the first flexible circuit connection hole and the second flexible circuit connection hole, and the first flexible circuit connection hole and the second flexible circuit connection hole are arranged adjacent to each other.

5. The multifunctional charging and data adapter according to claim 1, wherein the third circuit board comprises a third flexible circuit connection hole, the first flexible circuit connection hole, the second flexible circuit connection hole and the third flexible circuit connection hole are arranged adjacent to one another, the second flexible circuit board is configured to be connected between the third flexible circuit connection hole and the second flexible circuit connection hole, and a portion of the first flexible circuit board has a bending extension portion which extends to and is connected to the first circuit board.

6. The multifunctional charging and data adapter according to claim 1, wherein the first circuit board further comprises at least one memory card slot, the second circuit board and the charging module are disposed on a first surface of the first circuit board, and the at least one memory card slot is disposed on a second surface opposite to the first surface of the first circuit board.

7. The multifunctional charging and data adapter according to claim 1, further comprising:

a solid state drive (SSD) module, disposed at the first circuit board, the SSD module configured to be suitably electrically connected to at least one of the plurality of data transmission connection holes.

8. The multifunctional charging and data adapter according to claim 7, wherein the second circuit board and the charging module are disposed on a first surface of the first circuit board, and the SSD module is disposed on a second surface opposite to the first surface of the first circuit board.

9. The multifunctional charging and data adapter according to claim 1, wherein the first flexible circuit board and/or the second flexible circuit board are/is a double-layer board structure.

10. The multifunctional charging and data adapter according to claim 1, wherein the first flexible circuit board and/or the second flexible circuit board comprise(s) a shielding structure.

11. The multifunctional charging and data adapter according to claim 1, wherein the plurality of data transmission connection holes are compliant with a specification selected from a group consisting of USB type-C, USB type-A, HDMI, RJ45, SD card and micro SD card.

12. The multifunctional charging and data adapter according to claim 1, wherein the charging module is configured to be suitable for Power Delivery (PD).

13. The multifunctional charging and data adapter according to claim 1, wherein the first circuit board comprises a memory card data transmission module electrically connected to a memory card data transmission connection hole;

the second circuit board comprises a USB data transmission module electrically connected to a USB type-C data transmission connection hole, a USB type-A data transmission connection hole, and an HDMI data transmission connection hole, wherein connection hole directions of the USB type-C data transmission connection hole, the USB type-A data transmission connection hole, and the HDMI data transmission connection hole are disposed parallel to a normal vector of the second circuit board;

the third circuit board comprises an Ethernet data transmission module electrically connected to an Ethernet data transmission connection hole;

the second circuit board is disposed parallel to the third circuit board, and the second circuit board and the third circuit board are disposed perpendicular to the first circuit board;

the charging module, the second circuit board and the third circuit board are disposed on a first surface of the first circuit board, and the memory card data transmission connection hole is disposed on a second surface opposite to the first surface of the first circuit board; and the first circuit board and the second circuit board are electrically connected by the first flexible circuit board, and the second circuit board and the third circuit board are electrically connected by the second flexible circuit board.

* * * * *